United States Patent [19]
Ebinuma et al.

[11] Patent Number: 5,365,561
[45] Date of Patent: Nov. 15, 1994

[54] EXPOSURE CONTROL IN AN X-RAY EXPOSURE APPARATUS

[75] Inventors: Ryuichi Ebinuma, Kawasaki; Nobutoshi Mizusawa, Yamato; Masayuki Suzuki, Zama; Shinichirou Uno, Atsugi; Tetsuzo Mori, Atsugi; Hiroshi Kurosawa, Atsugi, all of Japan

[73] Assignee: Canon Kabushiki Kaisha, Tokyo, Japan

[21] Appl. No.: 182,535

[22] Filed: Jan. 18, 1994

Related U.S. Application Data

[63] Continuation of Ser. No. 995,919, Dec. 22, 1992, abandoned, which is a continuation of Ser. No. 887,668, May 26, 1992, abandoned, which is a continuation of Ser. No. 534,375, Jun. 7, 1990, abandoned, which is a continuation of Ser. No. 453,087, Dec. 21, 1989, abandoned, which is a continuation of Ser. No. 244,410, Sep. 14, 1988, abandoned.

[30] Foreign Application Priority Data

Mar. 25, 1988 [JP] Japan ................. 63-071040

[51] Int. Cl.$^5$ ............................. G21K 5/00
[52] U.S. Cl. .......................... 378/34; 378/160
[58] Field of Search ................. 378/34, 35, 160; 250/505.1

[56] References Cited

U.S. PATENT DOCUMENTS

| | | | |
|---|---|---|---|
| 3,069,549 | 12/1962 | Thompson | 378/160 |
| 3,934,151 | 1/1976 | Stowe | 378/160 |
| 3,980,407 | 9/1976 | Hill | 378/160 |
| 4,203,037 | 5/1980 | Gur et al. | 378/146 |
| 4,514,857 | 4/1985 | Kimura et al. | 378/34 |

FOREIGN PATENT DOCUMENTS

| | | |
|---|---|---|
| 0083394 | 7/1983 | European Pat. Off. |
| 0357425 | 3/1990 | European Pat. Off. |
| 56-104438 | 8/1981 | Japan |
| 60-37616 | 8/1985 | Japan |
| 60-198726 | 10/1985 | Japan |

OTHER PUBLICATIONS

Michel, *Die Wissenschaftliche und Angewandte Photographie* [Scientific and Applied Photography], pp. 171–181.

Primary Examiner—Craig E. Church
Attorney, Agent, or Firm—Fitzpatrick, Cella, Harper & Scinto

[57] ABSTRACT

Exposure control method and apparatus particularly suitably usable in an X-ray exposure apparatus, for exposing a mask and a wafer to radiation (X-rays) from a synchrotron to transfer a pattern formed on a mask onto the wafer, is disclosed. A shutter device for controlling passage and interception of the synchrotron radiation is provided between the synchrotron and the wafer. The shutter device includes a blade member having a leading edge and a trailing edge which are rectilinearly movable in a direction in which there exists non-uniformness in illuminance of the radiation. The leading edge is used to determine the timing of start of passage of the radiation to the wafer, while the trailing edge is used to determine the timing of interception of the radiation. The moving speeds of the leading edge and the trailing edge are controlled independently of each other to provide different exposure times for different portions of an exposure region on the wafer, in accordance with the non-uniformness in illuminance. By this, the amount of absorption of radiation by a resist material on the wafer can be make uniform throughout the exposure region.

68 Claims, 8 Drawing Sheets

EXPOSURE CONTROL IN AN X-RAY EXPOSURE APPARATUS

This application is a continuation of prior application Ser. No. 07/995,919 filed Dec. 22, 1992, which application is a continuation of prior application, Ser. No. 07/887,668 filed May 26, 1992, which application is a continuation of prior application, Ser. No. 07/534,375 filed Jun. 7, 1990, which application is a continuation of prior application, Ser. No. 07/453,087 filed Dec. 21, 1989, which application is a continuation of prior application, Ser. No. 07/244,410 filed Sep. 14, 1988, all now abandoned.

FIELD OF THE INVENTION AND RELATED ART

This invention relates to exposure control in an exposure apparatus for use in the manufacture of semiconductor microcircuits. More particularly, the invention is concerned with exposure control suitably usable in an X-ray exposure apparatus, for example, for exposing a mask and a wafer with a radiation (X-rays) from a synchrotron or otherwise to print a pattern of the mask upon the wafer.

In prior art X-ray exposure apparatuses, the amount of exposure is controlled in the following manner:

(1) From the sensitivity, to X-rays used, of a radiation-sensitive material (called a "resist") applied to a wafer and from the illuminance in the field of irradiation of the X-rays from a source (the illuminance being determined from experience), the exposure time for the whole irradiation field on the wafer is determined.

(2) An alternative is such that, as disclosed in Japanese Laid-Open Patent Application, Laid-Open No. Sho 60-198726, an X-ray detector is provided in the X-ray irradiation field and, while taking into account the variation in the X-ray illuminance with time, the exposure time for the whole irradiation field is determined.

SUMMARY OF THE INVENTION

In these prior art examples, the exposure time is determined uniformly over the entire irradiation field or an exposure region on a wafer. This involves a problem that, when there is non-uniformness in illuminance within the exposure region on the wafer, it is difficult to assure correct exposure throughout the exposure region. This causes inconveniences. For example, in X-ray lithography wherein a pattern of a linewidth on an order of 0.25 micron may be printed, it is possible that a semiconductor device formed on a wafer does not operate with a desired performance.

The non-uniformness in illuminance may be reduced by placing a radiation source far remote from a mask and a wafer. With this method, however, the illuminance itself within the whole exposure region on the wafer is reduced.

It is accordingly a primary object of the present invention to provide a system for controlling exposure in an exposure apparatus such as an X-ray exposure apparatus, by which the amount of radiation absorbed by a radiation-sensitive material in an exposure region can be made substantially uniform throughout every portion of the exposure region even if non-uniformness in illuminance is present within the exposure region.

In accordance with one aspect of the present invention, to achieve this object, a shutter means having a leading edge and a trailing edge is provided and the moving speed of each of the leading edge and the trailing edge when they pass the exposure region for the controlled passage and interception of the radiation, is controlled to ensure that at different portions of the exposure region different exposure times are set as desired.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
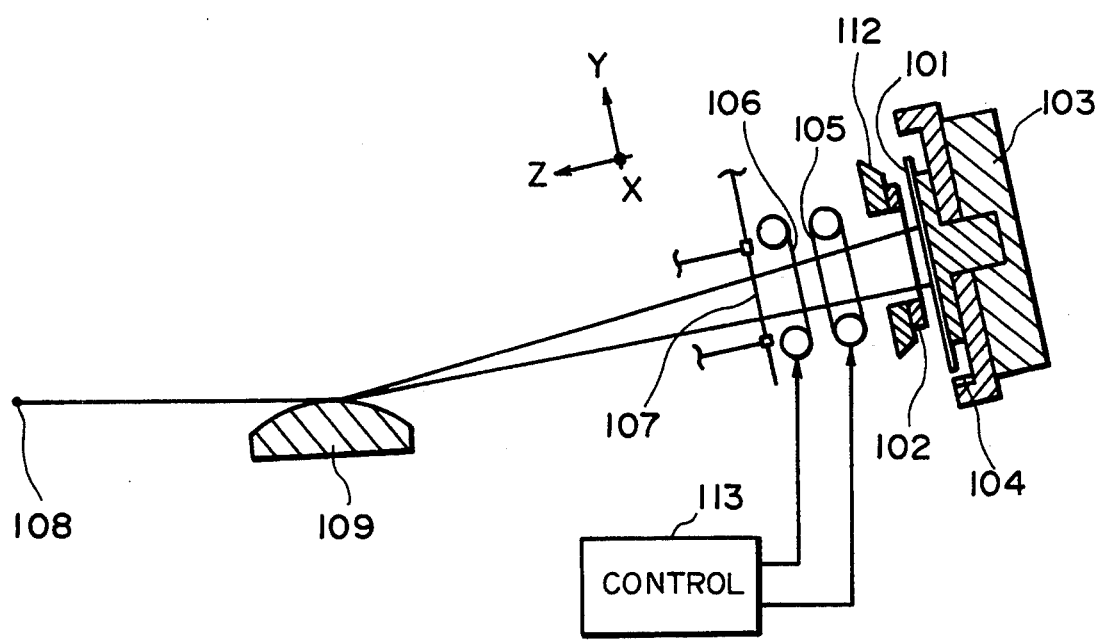
FIG. 1 is a principle view schematically showing an X-ray exposure system according to an embodiment of the present invention.

Referring first to FIG. 1, there is shown a major portion of an X-ray exposure apparatus to which the present invention is applied. In FIG. 1, a wafer 101 has a surface to which a radiation-sensitive material (resist) is applied. Mask 102 has formed thereon a pattern for manufacture of semiconductor devices. Mask stage 112 is adapted to hold the mask 102 parallel to the wafer 101 with a clearance (mask-to-wafer gap) of about 40 microns in a Z-axis direction. Wafer moving stage 103 is adapted to hold the wafer 101 and to move the same in each of the X-axis and Y-axis directions. The exposure apparatus of the present embodiment is arranged such that, by means of the stage 103, different shot areas (exposure regions) of a wafer 101 are placed, in a predetermined order, to be opposed to an irradiation field 120 (see FIG. 2), whereby the whole surface of the wafer 101 is exposed with radiation. At any one time, a pattern bearing portion of the mask 102 and one exposure region of the wafer 101 are placed at the irradiation field 120. In other words, the exposure apparatus of this embodiment is structured as a step-and-repeat type exposure apparatus, called a "stepper".

Sensor 104 is provided on the wafer moving stage 103 and is movable in the X and Y directions with the movement of the moving stage 103 so as to measure the illuminance at each of desired points in the irradiation field 120. Denoted generally at 105 is a main shutter mechanism having a movable aperture member. In this embodiment, the movable aperture member is provided by an endless belt having openings (apertures). The main shutter mechanism cooperates with an auxiliary shutter mechanism 106, to provide an exposure shutter device. The operation of each of the main shutter mechanism 105 and the auxiliary shutter mechanism 106 is controlled by a controller 113. More specifically, this controller 113 operates to control the main shutter mechanism 105, in a manner which will be described later, on the basis of the illuminance at each point within the irradiation field 120 as measured by use of the sensor 104. Also, the controller 113 operates to control the auxiliary shutter 106 so as to open the same before initiation of the exposure control by the main shutter mechanism 105 and to close the auxiliary shutter 106 after completion of the exposure control. Denoted at 107 is a beryllium thin film (partition film). The mask 102 side of this beryllium film 107 is maintained, for example, in a reduced-pressure He gas ambience, while a high-vacuum ambience is maintained on a radiation-source side of the film 107.

Denoted at 108 is a radiation emitting point of a synchrotron orbitration radiation (SOR) ring which functions as an X-ray source. The synchrotron radiation (X-rays) from the emission point 108 has a uniform intensity distribution in a direction (X-direction in this embodiment) parallel to the orbital plane of an electron beam 110 (see FIG. 2), but has a substantially symmetric intensity distribution with respect to a direction (Y direction) perpendicular thereto.

Figure 2:
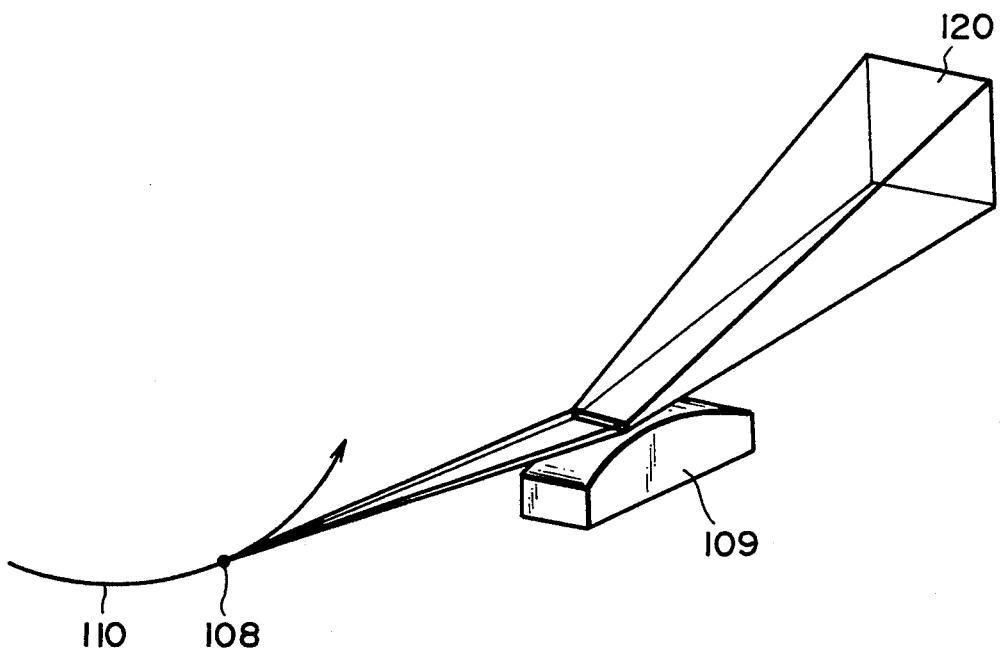
FIG. 2 is a schematic view of an illumination system using synchrotron radiation.
Figure 6:
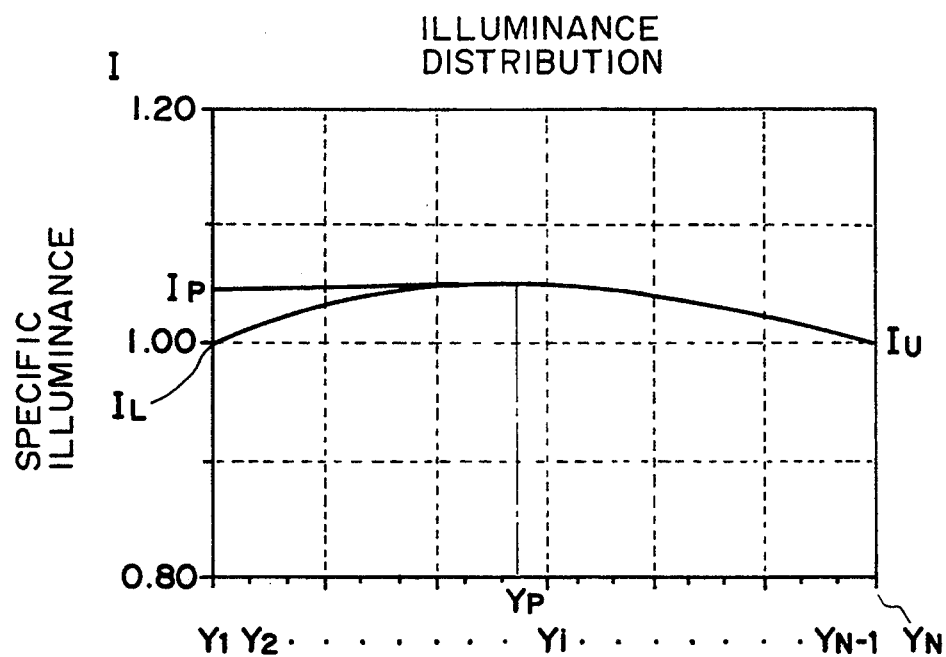
FIG. 6 is a graph showing an illuminance distribution provided by the illumination system of the FIG. 2 example.

As best seen in FIG. 2, a convex-surface cylindrical mirror 109 functions to expand the synchrotron radiation from the emission point 108 in the direction (Y direction) in which the radiation has a substantially symmetric intensity distribution. The cylindrical mirror 109 is used to provide an irradiation field 120 of a required dimension, at the position at which the mask 102 and one exposure region of the wafer 101 are placed. Usually, when a cylindrical mirror whose reflection surface has a single curvature is used, there occurs in the irradiation field 120 a one-dimensional (Y direction) illuminance distribution (non-uniformness) having one peak. An example of such an illuminance distribution is illustrated in FIG. 6. The curve in FIG. 6 has been drawn by plotting the results of the calculation of the illuminance distribution as weighted in consideration of the dependency, upon wavelength, of the sensitivity of a resist material applied to a wafer 101. The axis of the abscissa denotes the position, while the axis of the ordinate denotes a specific illuminance in which the illuminance is standardized by using the illuminance $I_L$ or $I_U$ ($=I_L$) at the position $Y_1$ or $Y_N$ as a reference ($=1$). Reference character $I_P$ denotes a peak illuminance, and reference character $Y_P$ denotes the position in the Y direction corresponding to the peak $Y_P$.

Figure 3:
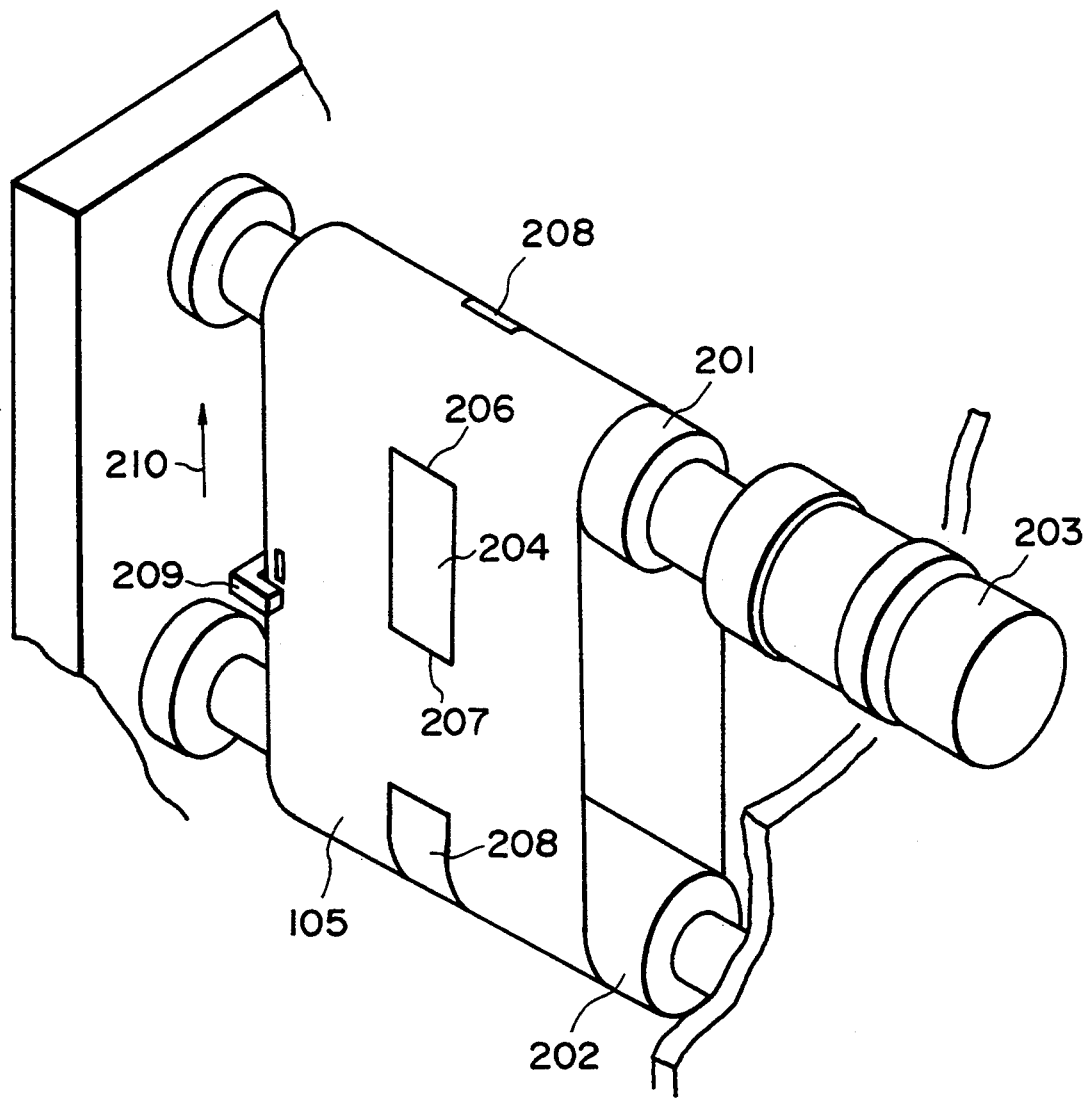
FIG. 3 is a fragmentary perspective view showing an example of a shutter device usable in the FIG. 1 embodiment.

FIG. 3 exemplifies a specific structure of a main shutter mechanism usable in the FIG. 1 embodiment. Belt 105 having an aperture 204 comprises a thin metal belt made of stainless steel, for example. This thin metal belt has a thickness sufficient for intercepting X-rays from the source.

The belt 105 is wound around rollers 201 and 202. By rotating one of these rollers by a driving motor 203, the aperture 204 of the belt 105 can operate as a movable aperture. Arrow 210 corresponds to the Y direction and denotes in FIG. 3 the direction of movement of the aperture 204, which direction is coincident with the direction in which the synchrotron radiation has non-uniformness in intensity. The belt 105 is provided with two apertures, one of which is denoted at 204, and another of which is denoted at 208. The aperture 204 functions as a movable aperture which is operable to locally control, along the Y direction, the exposure time for the exposure region. The aperture 204 has a leading edge 206 and a trailing edge 207. When the leading edge and the trailing edge of the aperture 204 moves through the exposure region in the Y direction, their moving speeds are controlled independently by the controller 113. The other aperture 208 is defined by an opening of a size and shape necessary for avoiding interception of the radiation from the source in a time period in which the movable aperture member provided by the opening 204 is in an open state.

Photosensor 209 is operable to detect the position of the aperture 204 and is used to determine the timing of passage of the aperture 204 through the exposure region.

Figure 4:
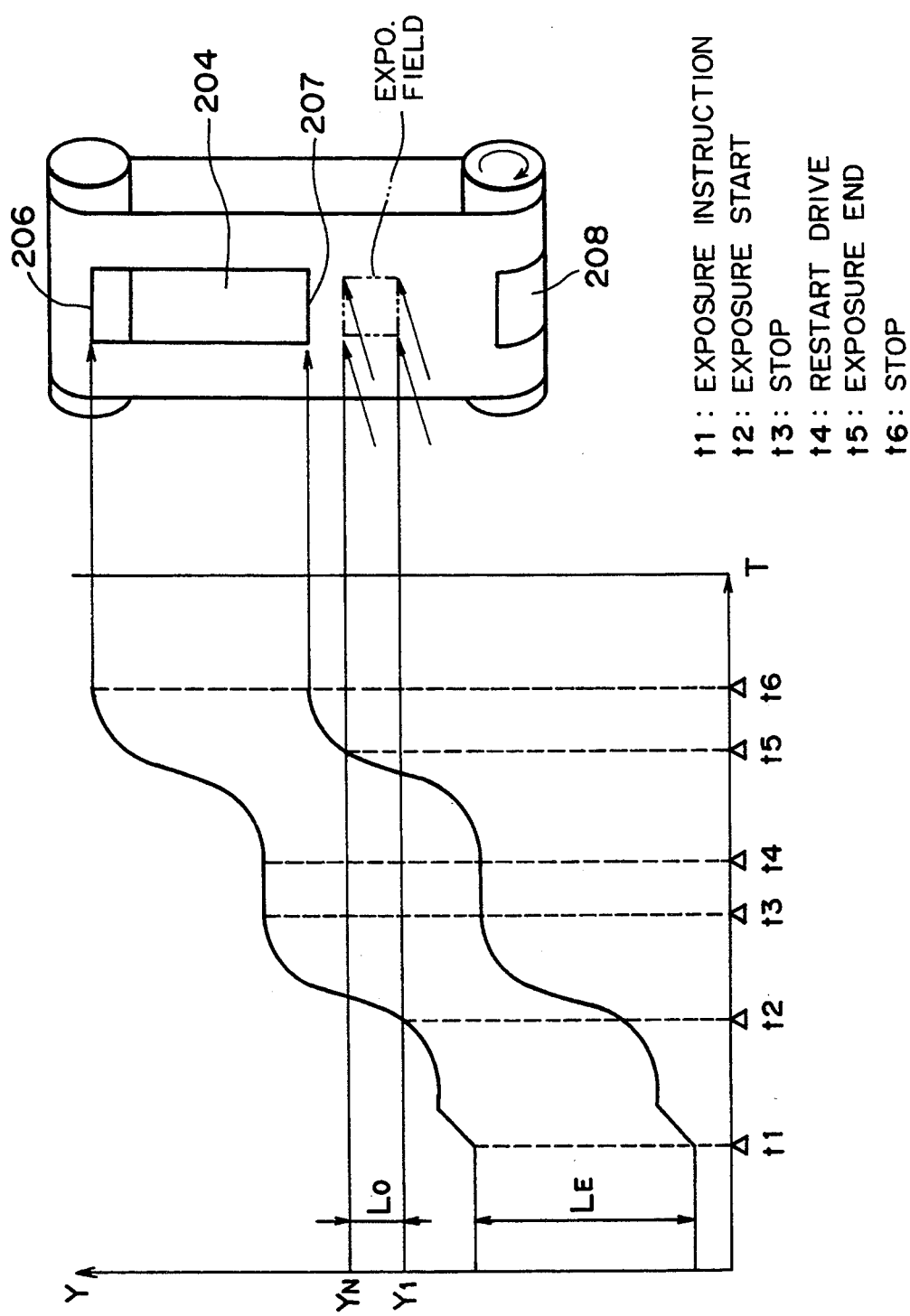
FIG. 4 is a schematic view showing the motion of a movable aperture member of the shutter device of the FIG. 3 example.

FIG. 4 exemplifies the manner of movement of the leading edge 206 and the trailing edge 207 of the aperture 204 (movable aperture). In FIG. 4, the axis of the abscissa denotes the time and the axis of the ordinate denotes the position of the movable aperture in its moving direction, namely, the position coordinate in the direction of non-uniformness in intensity of the radiation being projected. The zone as depicted at $L_O$ (from $Y_1$ to $Y_N$) corresponds to the exposure region (irradiation field) in FIG. 4, while reference character $L_E$ denotes the interval between the leading edge 206 and the trailing edge 207 of the aperture 204 in the Y direction. It is an important feature that, within the exposure region $L_O$, the moving speeds of the leading edge 206 and the trailing edge 207 change independently of each other. In an initial state, the aperture 204 is located at a position under the exposure region (exposure field), in FIG. 4. When exposure start is instructed, the controller 113 operates to actuate the motor 203 to move the belt 105 with the cooperation of the rollers 202 and 203, so that the positions of the leading edge 206 and the trailing edge 207 of the aperture 204 are changed with the lapse of time along the curves shown in FIG. 4. When the leading edge 206 reaches the position $Y_1$, the exposure starts. The leading edge 206 displaces between the positions $Y_1$ and $Y_N$ in such manner that the position of the leading edge 206 changes relatively slowly in the neighborhood of the position $Y_1$ whereas it changes relatively quickly in the neighborhood of the position $Y_N$. At this time, the trailing edge 207 has not reached the exposure region, because there is a relationship "$L_O < L_E$", After this and when a middle portion of the aperture 204 reaches the exposure region, the controller 113 stops the drive of the motor 203 and, thereafter, restarts the drive of the motor 203 at a suitable timing. When the trailing edge 207 reaches the position $Y_N$, the exposure is completed, and, thereafter, the drive of the motor 203 is stopped. The trailing edge 207 displaces such that the position of trailing edge 207 changes relatively quickly in the neighborhood of the position $Y_1$, whereas it changes relatively slowly in the neighborhood of the position $Y_N$. The reason for controlling the moving speed (displacement) of each of the leading edge 206 and the trailing edge 207 will be explained later.

Figure 7:
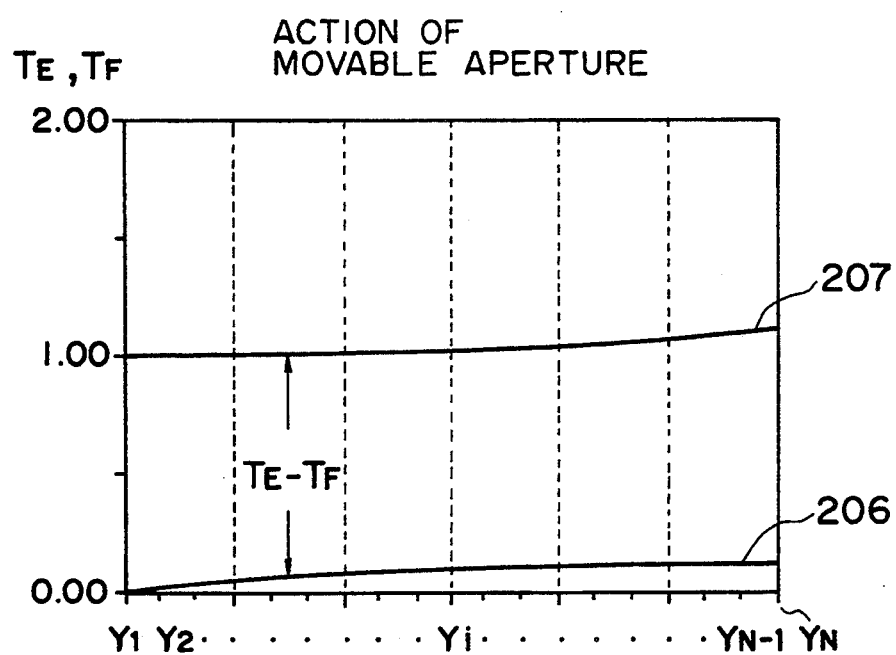
FIG. 7 is a graph showing the action of a movable aperture member.
Figure 8:
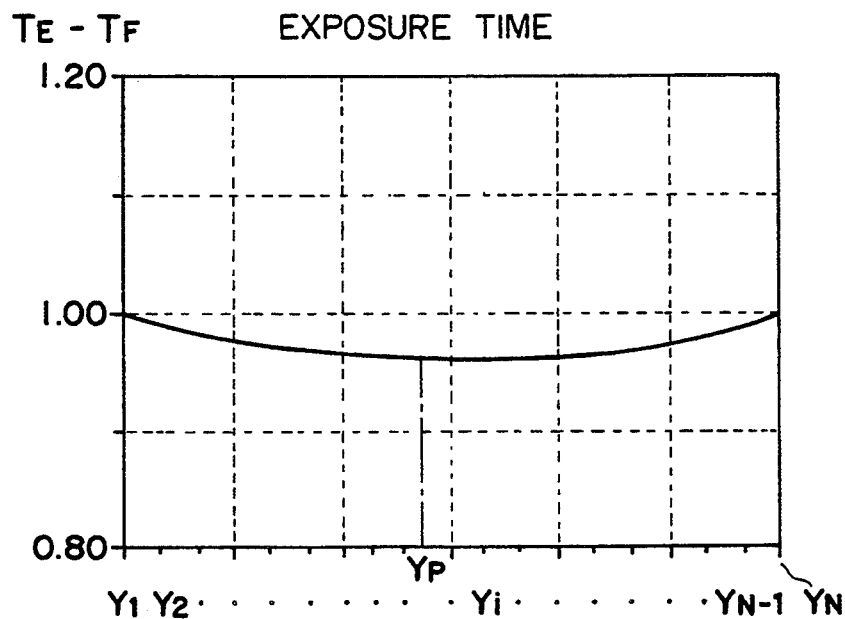
FIG. 8 is a graph showing a distribution of exposure time in the example of FIG. 7.

FIG. 7 shows changes in the position of each of the leading edge 206 and the trailing edge 207, moving between the positions $Y_1$ and $Y_N$ in FIG. 4. The axis of the abscissa denotes the position coordinate in the Y direction, while the axis of the ordinate denotes time. FIG. 8 shows the exposure time $(T_E-T_F)$ at each point $Y_i$ between the positions $Y_1$ and $Y_N$. In these Figures, reference character $T_F$ denotes the time at which the leading edge 206 reaches the point $Y_i$, and reference character $T_E$ denotes the time at which the trailing edge 207 passes the point $Y_i$. It is seen from FIG. 8 that, in the FIG. 4 example, the exposure time is shorter at the central portion of the exposure region (zone between $Y_1$ and $Y_N$) than that at marginal portions.

Figure 9:
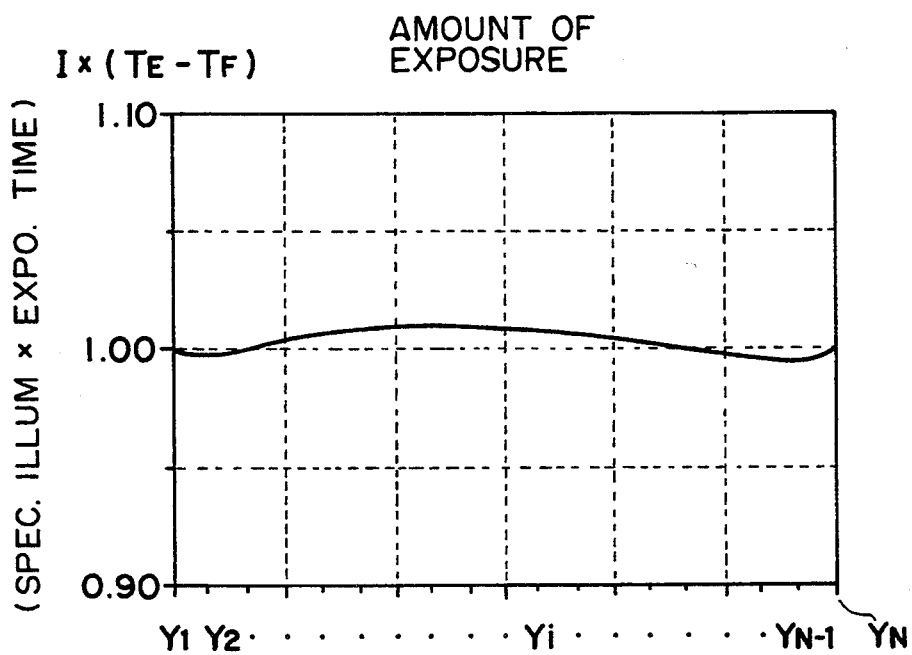
FIG. 9 is a graph showing a distribution of exposure as defined in accordance with the exposure time distribution of the FIG. 8 example.

In FIG. 9, the illustrated curve shows the illuminance at each point $Y_i$ (FIG. 6) as multiplied by the exposure time at each point $Y_i$ (FIG. 8). Namely, the graph of FIG. 9 shows the amount of exposure at each point $Y_i$ within the exposure region (actually, this corresponds to the amount of radiation absorbed by a resist material). It is seen from FIG. 9 that, by the provision of a speed-controlled movable aperture of the present embodiment, the amount of exposure can be made substantially uniform throughout the exposure region irrespective of that the radiation contains non-uniformness as shown in FIG. 6.

In the above-described example, the movable aperture moves through the exposure region by a constant acceleration motion. To be exact, accordingly, the amount of exposure in the exposure region is not completely uniform. However, depending on the manner of control of the movable aperture, it is in principle possible to make the amount of exposure completely uniform, over every point $Y_i$.

An example of this will be described below in detail.

Assume that, within the exposure region, a coordinate is set in the direction in which the illuminance changes. Points in the exposure region of a number N are selected and reference characters $Y_1, Y_2, \ldots$ and $Y_n$ are assigned to these points.

Actual illumination intensity at a position $Y_i$, as calculated on the basis of the data obtained by the measurement by the sensor 104 and having been weighted in accordance with the sensitivity-to-wavelength characteristics of a resist material on a wafer, is denoted by $I_i$. Assuming that the required amount of exposure is E, then a correct exposure time at the position $Y_i$ in the exposure region can be expressed as follows:

$$T_i = E/I_i \qquad (1)$$

On the other hand, the time at which the leading edge 206 of the movable aperture passes the point $Y_i$ is denoted by $T_{Fi}(P_1, P_2, \ldots)$. These reference characters $P_1, P_2, \ldots$ are parameters for controlling the operation of the movable aperture. Similarly, the time at which the trailing edge 207 of the movable aperture passes the point $Y_i$ is denoted by $T_{Ei}(P_1, P_2, \ldots)$.

For each parameter $P_k$, such a one by which the value E, determined by the following equation, becomes minimum is determined by the following calculation:

$$E = \partial \sum_i (T_{Ei} - T_{Fi} - T_i)^2 \qquad (2)$$

The motion of the movable aperture is controlled accordingly.

By doing so, it is possible to minimize the error caused in relation to the control of the movable aperture.

If control parameters of a number not less than N are set, it is possible to establish the following relationship with respect to each point $Y_i$ on the exposure region:

$$T_{Ei}-T_{Fi}-T_i \pm 0 \qquad (3)$$

In this case, it is possible to provide the same amount of exposure at every point $Y_i$ in the exposure region. Therefore, it is possible to assure, at high precision, uniform exposure over the whole exposure region.

Taking this case as an example, a moving method by which the exposure can be completed in the shortest time will be explained below.

It is assumed now that $Y_1$ and $Y_N$ denote the ends of the exposure region; the movable aperture is moved in the direction from the point $Y_1$ to the point $Y_N$; an illuminance distribution such as shown in FIG. 6 is provided; $I_p$ denotes the peak of the illuminance distribution in the exposure region; $Y_p$ denotes the position which provides the peak; $I_L = I_1$; and $I_U = I_N$.

In an example when, as shown in FIG. 4, the movable aperture is provided by one endless belt having an aperture 204, and if the length $L_E$ of the aperture satisfies the following relation:

$$L_E \geq \max(|Y_P-Y_1|, |Y_N-Y_P|),$$

then, the movable aperture may be moved such a manner that the time $T_{Fi}$ and the time $T_{Ei}$ at which each point $Y_i$ is passed by the leading edge 206 and the trailing edge 207 of the aperture 204, with a maximum speed Vmax of the movable aperture, can be expressed by the following equations:

1) $Y_i \leq Y \leq Y_p$
$$T_{Fi} = T_{F0} = E/I_L - T_i + (Y_i - Y_1)/V\text{max} \qquad (4)$$
$$T_{Ei} = T_{Fi} + T_i \qquad (5)$$

2) $Y_P \leq Y \leq Y_N$
$$T_{Fi} = T_{F0} + E/I_L - E/I_P + (Y_i - Y_1)/V\text{max} \qquad (6)$$
$$T_{Ei} = T_{Fi} + T_i \qquad (7)$$

wherein $T_{F0}$ is the time at which the leading edge 206 passes the point $Y_1$ ($T_{F1}=T_{F0}$).

Figure 10:
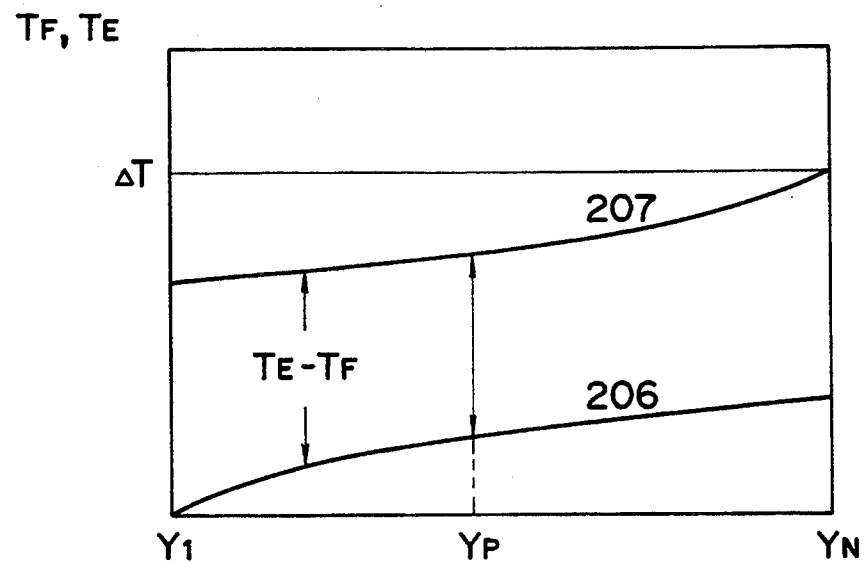
FIG. 10 is a graph showing idealistic motion of a movable aperture member.

The manner of motion of the leading edge 206 and the trailing edge 207 as determined by equations (4), (5), (6) and (7) is shown in FIG. 10. Also, in this example, like the FIG. 7 example, the leading edge 206 displaces relatively slowly in the neighborhood of the point $Y_1$. The moving speed gradually increases and, in the neighborhood of the position $Y_N$, the leading edge moves relatively quickly. On the other hand, the trailing edge 207 moves relatively quickly in the neighborhood of the position $Y_1$ and the moving speed gradually decreases, such that the trailing edge moves relatively slowly in the neighborhood of the position $Y_N$. Also, the exposure time $(T_{Ei}-T_{Fi})$ in the exposure region is shortest at the position $Y_P$.

In this case, the time period $\Delta T$ from the entrance of the leading edge 206 of the aperture 204 into the exposure region to the exit of the trailing edge 207 of the aperture 204 from the exposure region is given by the following equation:

$$\begin{aligned}\Delta T &= T_{EN} - T_{Fl} \\ &= E/I_L - E/I_P + T_N + (Y_N - Y_1)/V\text{max} \\ &= E/I_L - E/I_P + E/I_U + L_0/V\text{max}\end{aligned} \qquad (8)$$

Among various types of the motion of the movable aperture, satisfying equation (3), the above-described is the one that provides the minimum of the time ($\Delta T$).

Particularly, when $L_O \leq L_E$, the leading edge 206 and the trailing edge 207 do not exist in the exposure region at the same time. Therefore, the maximum speed Vmax can be determined as desired within a range of $E/I_L > L_O/V\text{max}$.

The motion according to equations (4) to (7) provides a minimum time $\Delta T$. However, it should be noted that the motion represented by these equations is not the sole solution. Any motion may be adopted, provided that equations (5) and (7) are satisfied.

Further, according to another important feature of the present invention, as long as the illuminance distribution is continuous, uniform exposure is attainable with regard to any illuminance distribution.

Equations (4) to (7) show one solution for such a moving method.

Namely, the leading edge 206 may be moved in accordance with equation (4) in such a region wherein $T_i$ decreases in the moving direction, whereas the leading edge may be moved in accordance with equation (6) in such a region wherein $T_i$ increases.

Figure 5:
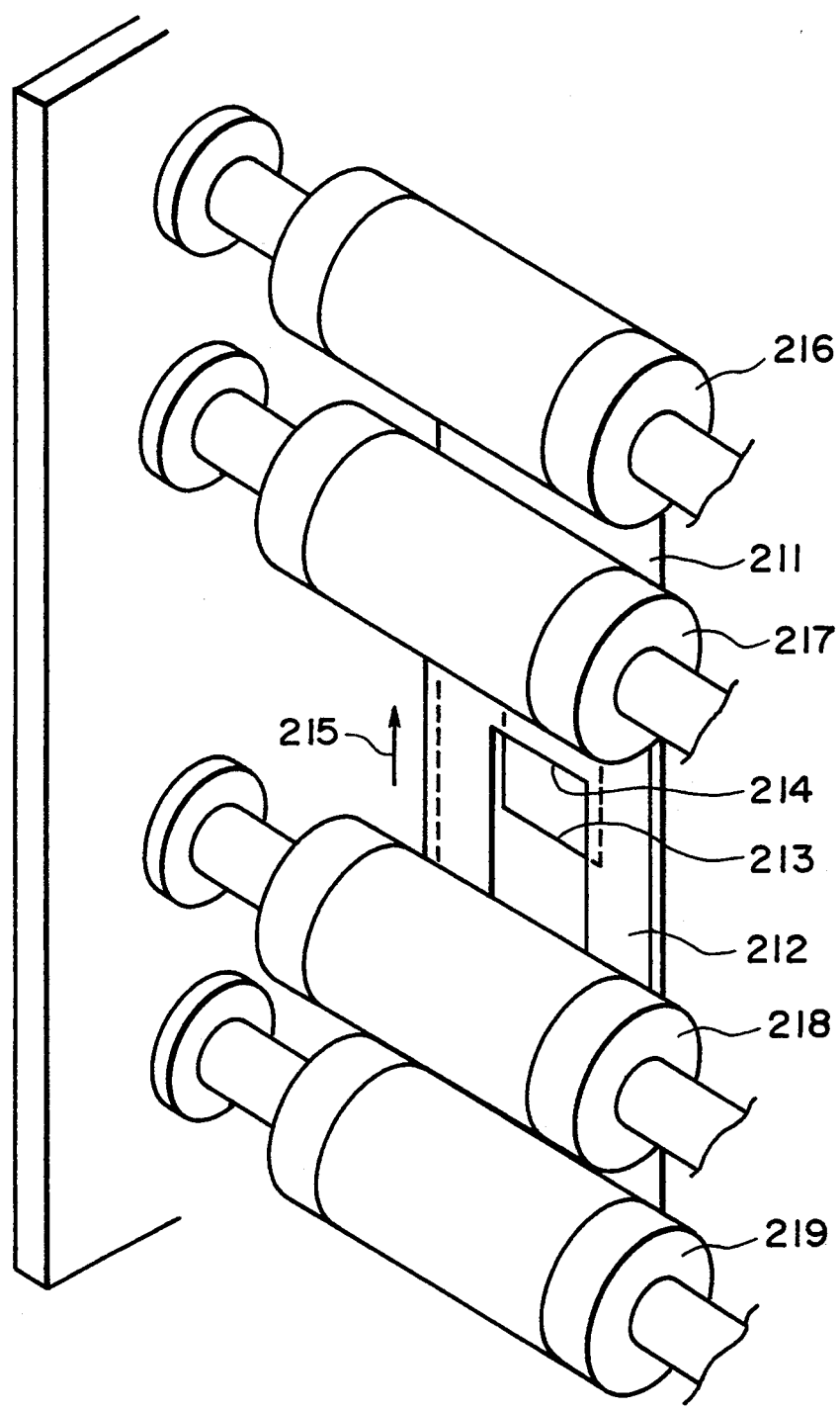
FIG. 5 is a fragmentary schematic view showing another example of a shutter device usable in the FIG. 1 embodiment.

Referring now to FIG. 5, another embodiment of a shutter device will be described.

Denoted in FIG. 5 by reference numerals 211 and 212 are two separate movable aperture members each being in the form of a belt member, in this embodiment. The movable aperture member 211 is wound around driving rollers 216 and 219, while the other aperture member 212 is wound around driving rollers 217 and 218. Arrow 215 denotes the moving direction of these aperture members for the exposure control.

In this embodiment, the origin sensor and the driving actuator of the FIG. 3 embodiment are omitted. Reference numeral 214 denotes an edge of an opening of the aperture member 212, and this edge has a function substantially the same as that of the leading edge 206 of the FIG. 3 embodiment. Reference numeral 213 denotes an edge of an opening of the aperture member 211, and this edge has a function substantially the same as that of the trailing edge 207 of the FIG. 3 embodiment.

When the leading edge and the trailing edge of a shutter device is provided by two separately movable members, as in the present embodiment, an auxiliary shutter member such as at 106 in FIG. 1 may be omitted.

Further, in the present embodiment, the length $L_E$ of the opening in the FIG. 4 example can be made apparently variable. Therefore, a higher degree of freedom is provided with respect to the control.

In the extension of the method of the present invention, which assures uniform exposure by use of movable aperture means, equation (8) provides an optimization method for the design of the illumination system shown in FIG. 2. This will be described below in greater detail.

Figure 11:
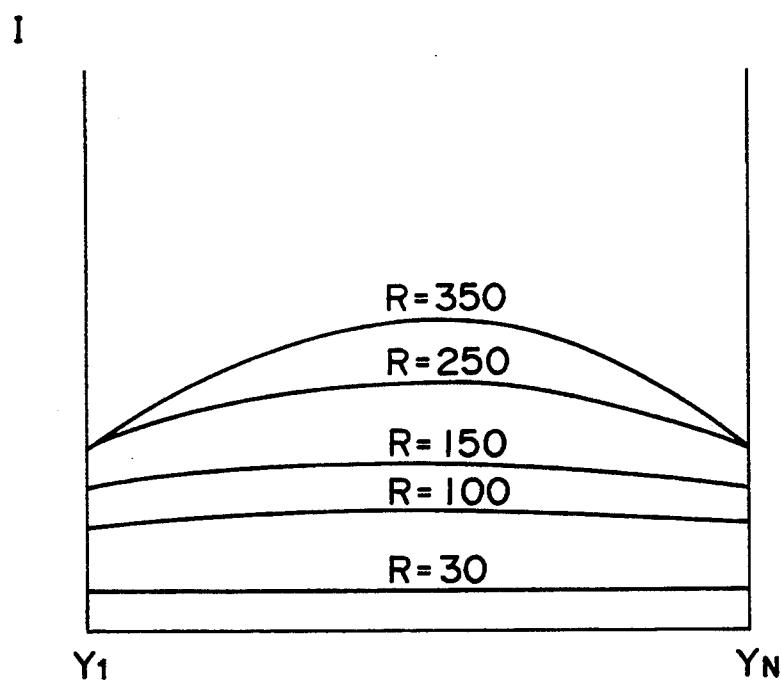
FIG. 11 is a graph showing changes in the illuminance distribution with the change in the curvature (radius of curvature) of a cylindrical mirror of the illumination system of the FIG. 2 example.

FIG. 11 shows the illuminance distribution in the exposure region which varies with the change in the curvature 1/R of the convex-surface cylindrical mirror 109 of the illumination system shown in FIG. 2.

In the particular example shown in FIG. 11, calculations were made under the conditions that: the critical wavelength $\lambda_L$ of the synchrotron radiation was 10.2 Å; the intrinsic diversive angle $\sigma$ at the critical wavelength $\lambda_L$ was 0.44 mrad; the distance between the emission point 108 of the synchrotron radiation and the reflection center of the mirror 109 was about 5 m; the distance between the reflection center of the mirror 109 and the movable aperture 105 was about 7 m; and the size $L_O$ of the exposure region in the Y direction was about 30 mm (the Y direction is substantially vertical, although the inclination is emphasized in FIG. 1). Under these conditions, and while taking into account the angle of incidence of the radiation upon the mirror 109, the calculations were made.

Figure 12:
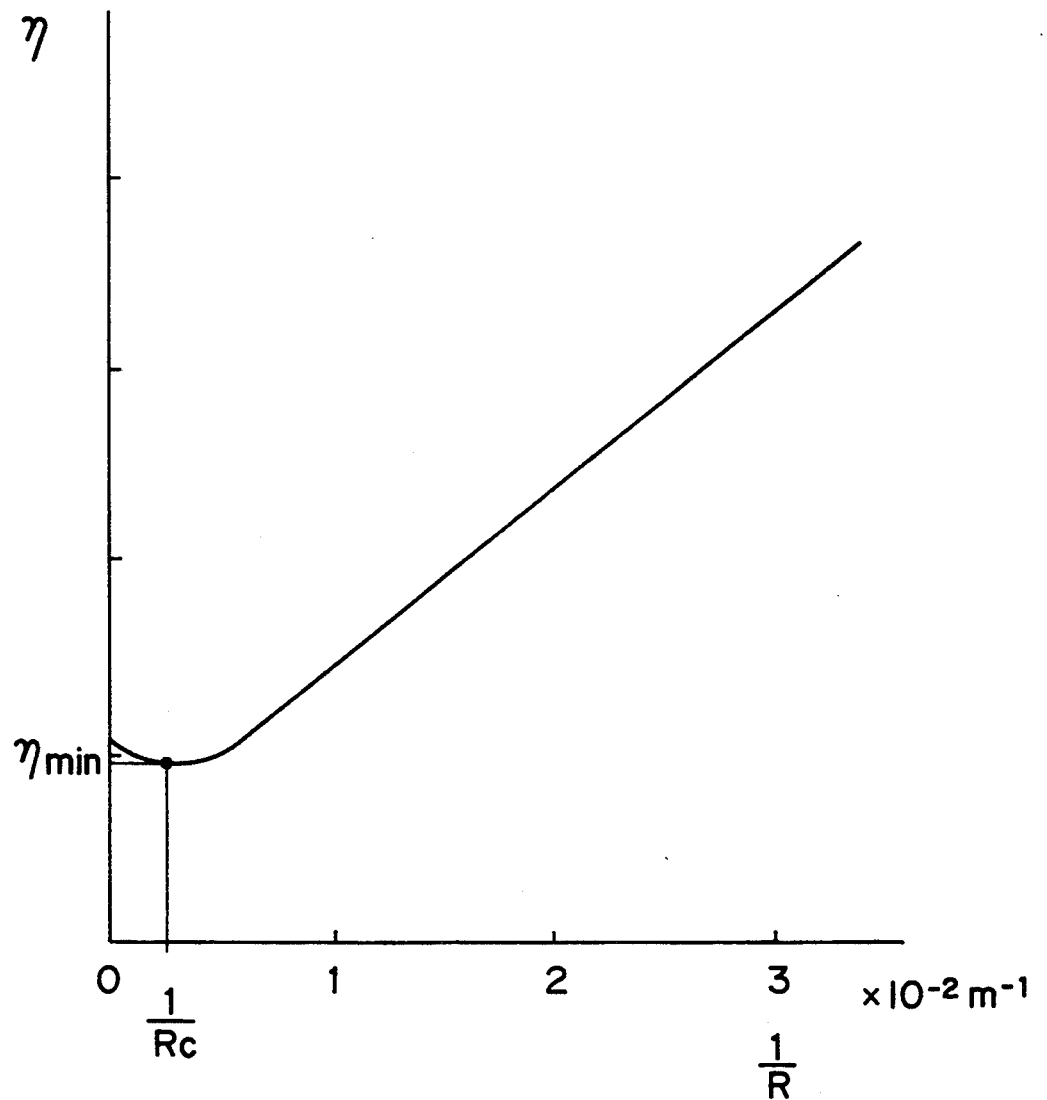
FIG. 12 is a graph showing an optimum value of the curvature (radius of curvature) of the cylindrical mirror.

FIG. 12 is a graph wherein the axis of the abscissa denotes 1/R while the axis of the ordinate denotes $\eta$ which, on an occasion when the movable aperture means is moved in accordance with equations (4) to (7), can be expressed by the following equation (9):

$$\eta = 1/I_U + 1/I_L - 1/I_P \qquad (9)$$

$$\Delta T = \eta E + L_0/V\text{max} \qquad (10)$$

As seen in this Figure, there exists such a radius of curvature (Rc) of the convex-surface cylindrical mirror 109 that provides the minimum ordinate value. While the value Rc is variable depending on the profile of the synchrotron radiation source and the size of the exposure field as well as the disposition of the radiation source, the mirror and the mask, for example, it is possible to assure an exposure system having a shortest opening time for the shutter and having a good efficiency with respect to time, by selecting, as the radius of curvature of the convex-surface cylindrical mirror, such an Rc that provides the minimum of $\eta$ as represented by equation (9).

However, upon actual determination of the radius of curvature, the selection of Rc does not always provide a best result.

In the method of the present invention making the exposure uniform, error factors which affect the same include an error in the measurement of illuminance, an error in the control of the moving speed of the movable aperture, and so on.

The tolerances for these errors are determined with respect to the required precision for the amount of exposure. Each error can be reduced more easily, with smaller non-uniformness in the intensity of radiation. This is in the tendency to reduce the radius of curvature of the cylindrical mirror and, therefore, increases the exposure time. To enlarge the radius of curvature of the cylindrical mirror beyond Rc causes larger non-uniformness in the radiation and, additionally, the prolongation of the exposure time. Therefore, to do so provides no merit.

As will be understood from the above, it is desirable to take the value Rc as an upper limit for the radius of curvature of the cylindrical mirror and to select a smaller radius of curvature within a range that does not increase the exposure time beyond a tolerable level.

When the radius R is small, on the other hand, the non-uniformness in the intensity of radiation becomes small and the effectiveness of the present invention, making uniform the exposure by the action of the movable aperture means, may be reduced. But, the illuminance itself becomes too low. In consideration of this, when the radius of curvature of the cylindrical mirror that provides the minimum $\eta$ min is denoted by Rc, the radius R may desirably be within the limit of about $3 \times \eta$ min.

In the particular example of FIG. 12, the radius R=30 m defines an intensity distribution which provides "$3.6 \times \eta$ min".

In the foregoing embodiments, the motion of the movable aperture has been described with reference to an example wherein the illuminance distribution has one peak. However, as long as the illuminance distribution is one dimensional and the illuminance changes continuously, the present invention is applicable to any profile of distribution and assures uniform exposure. Thus, the present invention is applicable not only to an illumination system having a cylindrical mirror, but also to any other illumination system using any other optical component such as a non-cylindrical mirror, for example.

With regard to the illuminance distribution I, it may be measured after execution of actual exposure and development. Alternatively, it may be detected by calculations based on the ray tracing the synchrotron radiation.

In accordance with the present invention, as described hereinbefore, a speed-controllable movable aperture means is provided, as an exposure shutter, in an exposure apparatus having an illumination system which provides radiation containing non-uniformness in the illuminance within an exposure field, and the aperture means is controlled to locally control the exposure time. By this, the non-uniformness in the amount of exposure (the amount of radiation absorbed by the resist material) resulting from the non-uniformness in the illuminance can be reduced remarkably, with the result that the resolution of the exposure apparatus can be improved significantly.

Further, since the precision itself for the uniformness in the exposure as required from the point of resolution in the exposure process can be satisfied by the local exposure time control of the present invention using the movable aperture means, the tolerance for the non-uniformness in illuminance as can be set for the illumination system side is determined by the performance of this local exposure time control, and a significantly wider tolerance is allowed as compared with that for the non-uniformness as allowed conventionally.

Usually, the magnitude of the illuminance and the uniformness thereof are somewhat incompatible factors with respect to the design of an illumination system. Therefore, if the tolerance for the non-uniformness becomes wider, as in the present invention, the illuminance can be made higher correspondingly. This makes it possible to reduce the exposure time and to reduce the exposure error due to the variation with time during the exposure. Additionally, this makes it possible to increase the processing speed of the apparatus, called "throughput".

In the foregoing, it is shown that an exposure apparatus according to the present invention having a movable aperture means can accomplish more precise and correct exposure even when it is used with an illumination system that provides a much higher intensity of illumination than that of prior art illumination systems. By using the exposure time as an evaluation function, an index is given in the optimum designing of an illumination system.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a mask and a wafer with synchrotron radiation to transfer a pattern formed on the mask onto a radiation-sensitive material applied to the wafer, said apparatus comprising:

a shutter having a leading edge effective to start exposure of a region on the wafer to the radiation and a trailing edge effective to finish the exposure of the region to the radiation, each of said leading edge and said trailing edge being movable in a direction of non-uniformness in illuminance of the radiation within the region; and control means for controlling said shutter, said control means being operable to control the moving speed of each of said leading edge and said trailing edge, when the same moves through the region, to define different exposure times with respect to different portions of the region, so as to substantially make uniform, throughout the region, the amount of radiation absorbed by the radiation-sensitive material applied to the wafer.

2. An exposure apparatus for exposing a mask and a wafer with synchrotron radiation to transfer a pattern formed on the mask onto a radiation-sensitive material applied to the wafer, said apparatus comprising:

a shutter having a leading edge effective to start exposure of a region on the wafer to the radiation and a trailing edge effective to finish the exposure of the region to the radiation, each of said leading edge and said trailing edge being movable in a direction of non-uniformness in illuminance of the radiation within the region, wherein said shutter includes a belt member movable in said direction and is formed with an opening having said leading edge and said trailing edge; and control means for controlling said shutter, said control means being operable to control the moving speed of each of said leading edge and said trailing edge, when the same moves through the region, to define different exposure times with respect to different portions of the region, so as to make substantially uniform, throughout the region, the amount of radiation absorbed by the radiation-sensitive material applied to the wafer.

3. An apparatus according to claim 2, wherein said opening satisfies the following relation:

$$L_E \geqq \max(|Y_P-Y_1|, |Y_N-Y_P|)$$

wherein $L_E$ is the distance between said leading edge and said trailing edge, $Y_1$ is a coordinate position of an end of the region, $Y_N$ is a coordinate position of the other end of the region and $Y_P$ is a coordinate position of a peak illuminance in the region.

4. An apparatus according to claim 2, wherein said control means controls the motions of said leading edge and said trailing edge, independently of each other, so that said leading edge and said trailing edge pass through the region with different displacement profiles.

5. An exposure apparatus for exposing a mask and a wafer with synchrotron radiation to transfer a pattern formed on the mask onto a radiation-sensitive material applied to the wafer, said apparatus comprising:
- a shutter having a leading edge effective to start exposure of a region on the wafer to the radiation and a trailing edge effective to finish the exposure of the region to the radiation, each of said leading edge and said trailing edge being movable in a direction of non-uniformness in illuminance of the radiation within the region, wherein said shutter comprises plurality of belt members each being movable in said direction and wherein one of said belt members is formed with an opening having said leading edge and another belt member is formed with an opening having said trailing edge; and
- control means for controlling said shutter, said control means being operable to control the moving speed of each of said leading edge and said trailing edge, when the same moves through the region, to define different exposure times with respect to different portions of the region, so as to make substantially uniform, throughout the region, the amount of radiation absorbed by the radiation-sensitive material applied to the wafer.

6. An exposure apparatus for exposing a mask and a wafer with radiation energy to transfer a pattern formed on the mask onto a radiation-sensitive material applied to the wafer, said apparatus comprising:
- a shutter having a leading edge effective to start exposure of a region of the wafer to the radiation energy and a trailing edge effective to finish the exposure of the region to the radiation energy, each of said leading edge and said trailing edge being movable in a direction of non-uniformness in illuminance of the radiation energy within the region; and
- control means for controlling said shutter, said control means being operable to cause said leading edge and said trailing edge of said shutter to pass through the region with different motions so as to make substantially uniform, throughout the region, the amount of radiation energy absorbed by the radiation-sensitive material applied to the wafer.

7. An exposure apparatus for exposing a mask and a wafer with radiation energy to transfer a pattern formed on the mask onto a radiation-sensitive material applied to the wafer, said apparatus comprising:
- a shutter having a leading edge effective to start exposure of a region of the wafer to the radiation energy and a trailing edge effective to finish the exposure of the region to the radiation energy, each of said leading edge and said trailing edge being movable in a direction of non-uniformness in illuminance of the radiation energy within the region, wherein said shutter comprises a belt member movable in said direction and being formed with an opening having said leading edge and said trailing edge: and
- control means for controlling said shutter, said control means being operable to cause said leading edge and said trailing edge of said shutter to pass through the region with different motions so as to make substantially uniform, throughout the region, the amount of radiation energy absorbed by the radiation-sensitive material applied to the wafer.

8. An apparatus according to claim 7, wherein said opening satisfies the following relation:

$$L_E \geq \max(|Y_P - Y_1|, |Y_N - Y_P|)$$

wherein $L_E$ is the distance between said leading edge and trailing edge, $Y_1$ is a coordinate position of an end of the region, $Y_N$ is a coordinate position of the other end of the region and $Y_P$ is a coordinate position of a peak illuminance in the region.

9. An exposure apparatus having an exposure zone, for exposing a mask and a wafer with synchrotron radiation to transfer a pattern of the mask to a radiation-sensitive material applied to the wafer, said apparatus comprising:
- a shutter having a leading edge effective to start exposure and a trailing edge effective to stop the exposure, said leading and trailing edges being movable in a direction of non-uniformness in illuminance in said exposure zone; and
- control means for controlling movement of said leading edge and said trailing edge of said shutter so as to make substantially uniform the amount of absorption of the radiation by the radiation-sensitive material of the wafer, in a region of the wafer corresponding to said exposure zone;
- wherein the radiation beam and said exposure zone satisfy a relationship $\eta \leq \eta_{min} \times 3$ wherein $\eta_{min}$ is a minimum of $\eta$ which is expressed by $$\eta = 1/I_U + 1/I_L - 1/I_P$$

where $I_U$ is illuminance at an end of said exposure zone in said direction, $I_L$ is illuminance at another end of said exposure zone in said direction and $I_P$ is peak illuminance in said exposure zone.

10. An exposure apparatus having an exposure zone, for exposing a mask and a wafer with synchrotron radiation to transfer a pattern of the mask to a radiation-sensitive material applied to the wafer, said apparatus comprising:
- a shutter having a leading edge effective to start exposure and a trailing edge effective to stop the exposure, said leading and trailing edges being movable in a direction of non-uniformness in illuminance in said exposure zone; and
- control means for controlling said shutter to control moving speeds of said leading edge and said trailing edge passing said exposure zone, so as to provide different exposure times at different portions of said exposure zone to make substantially uniform the amount of absorption of the radiation by the radiation-sensitive material in a region of the wafer corresponding to said exposure zone.

11. An exposure apparatus for use with synchrotron radiation, said apparatus comprising:
- a mask holder for holding a mask;
- a wafer holder for holding a wafer having radiation sensitive material applied thereto;
- a shutter for printing by the synchrotron radiation a pattern of the mask onto the radiation sensitive material applied to the wafer, said shutter having a leading edge effective to start exposure of a predetermined zone of the wafer to the synchrotron radiation and a trailing edge effective to stop the exposure, wherein said leading edge and said trailing edge are movable in the same direction; and control means for controlling the moving speed of each of said leading edge and said trailing edge to provide different exposure time periods to those portions of the predetermined zone which are defined along the direction of movement.

12. An apparatus according to claim 11, wherein said shutter includes a belt member having an opening, a portion of which is defined by said leading edge and another portion of which is defined by said trailing edge.

13. An apparatus according to claim 12, wherein said belt member comprises an endless belt member.

14. An apparatus according to claim 11, wherein said shutter includes a first belt member having an opening, a portion of which is defined by said leading edge and a second belt member having an opening, a portion of which is defined by said trailing edge.

15. An exposure method for use with synchrotron radiation and with a shutter having a leading edge and a trailing edge, said method comprising the steps of:

moving the leading edge of the shutter in accordance with a first speed profile to start exposure of different portions of a predetermined zone of a workpiece at different time periods; and moving the trailing edge of the shutter in accordance with a second speed profile to stop the exposure of the different portions of the predetermined zone of the workpiece at different time periods;

wherein said first and second speed profiles are different from each other.

16. A method according to claim 15, further comprising the steps of defining different portions of the workpiece in a predetermined direction and moving both the leading edge and the trailing edge of the shutter in the predetermined direction.

17. A method according to claim 15, further comprising interrelating the steps of moving the leading edge and moving the trailing edge of the shutter to provide different exposure time periods to the different portions of the predetermined zone of the workpiece.

18. A method according to claim 15, further comprising interrelating the steps of moving the leading edge and moving the trailing edge of the shutter to provide an exposure time period to an inside portion of the predetermined zone of the workpiece shorter than to outside portions of the predetermined zone of the workpiece.

19. An exposure apparatus for use with synchrotron radiation, said apparatus comprising:

a mirror for expanding the range of irradiation provided by the synchrotron radiation;

a shutter for exposing by the synchrotron radiation a predetermined zone of a wafer to a pattern of a mask, said shutter having a leading edge effective to start the exposure and a trailing edge effective to stop the exposure; and control means for controlling movement of said leading edge and said trailing edge of said shutter to provide different exposure time periods to different portions of the predetermined zone of the wafer.

20. An apparatus according to claim 19, wherein the different portions of the predetermined zone of the wafer are defined along a predetermined direction and wherein said leading edge and said trailing edge of said shutter are movable in the predetermined direction.

21. An apparatus according to claim 19, wherein said control means controls movement of said leading edge and said trailing edge of said shutter to provide an exposure time period to an inside portion of the predetermined zone of the wafer shorter than to outside portions of the predetermined zone of the wafer.

22. An exposure apparatus for use with synchrotron radiation, said apparatus comprising:

a mirror for expanding the range of irradiation provided by the synchrotron radiation;

a shutter for exposing by the synchrotron radiation a predetermined zone of a wafer to a pattern of a mask, said shutter having a movable leading edge effective to start the exposure and a movable trailing edge effective to stop the exposure; and control means for controlling movement of said leading edge and said trailing edge of said shutter in accordance with respectively different speed profiles, based on a predetermined illuminance profile of the synchrotron radiation expanded by said mirror.

23. An apparatus according to claim 22, wherein said leading edge and said trailing edge of said shutter are movable in the same direction.

24. An apparatus according to claim 22, wherein said control means controls movement of said leading edge and said trailing edge of said shutter to provide different exposure time periods to different portions of the predetermined zone of the wafer.

25. An apparatus according to claim 22, wherein said control means controls movement of said leading edge and said trailing edge of said shutter to provide an exposure time period to an inside portion of the predetermined zone of the wafer shorter than to outside portions of the predetermined zone of the wafer.

26. An exposure apparatus for use with synchrotron radiation, said apparatus comprising:

a support table for supporting a workpiece having a radiation sensitive zone;

introducing means for introducing the synchrotron radiation to the radiation sensitive zone of the workpiece; and a shutter device associated with said introducing means for controlling exposure of the radiation sensitive zone of the workpiece to the synchrotron radiation, said shutter device comprising a leading edge effective to start the exposure of the radiation sensitive zone and a trailing edge effective to stop the exposure of the radiation sensitive zone, said shutter device further comprising control means for controlling movement of said leading edge and said trailing edge of said shutter device in accordance with respectively different speed profiles so as to make substantially uniform the amount of radiation absorbed by the radiation sensitive zone of the workpiece.

27. An apparatus according to claim 26, wherein said leading edge and said trailing edge of said shutter device are movable in the same direction to provide different exposure time periods to different portions of the radiation sensitive zone of the workpiece, which portions are defined along the direction of movement.

28. An apparatus according to claim 26, wherein said shutter device includes a belt member having an opening, a portion of which is defined by said leading edge and another portion of which is defined by said trailing edge.

29. An exposure apparatus according to claim 28, wherein said belt member comprises an endless belt member.

30. An apparatus according to claim 26, wherein said shutter device includes a first belt member having an opening, a portion of which is defined by said leading edge and a second belt member having an opening, a portion of which is defined by said trailing edge.

31. An exposure apparatus for use with synchrotron radiation, said apparatus comprising:
 a mirror for expanding the range of irradiation provided by the synchrotron radiation;
 a shutter for exposing by the synchrotron radiation a predetermined zone of a workpiece to an original, said shutter having a movable leading edge effective to start the exposure and a movable trailing edge effective to stop the exposure;
 measuring means for measuring an illuminance profile of the synchrotron radiation expanded by said mirror; and
 control means for controlling movement of said leading edge and said trailing edge of said shutter in response to the synchrotron radiation illuminance profile expanded by said mirror and measured by said measuring means.

32. An apparatus according to claim 31, wherein said control means controls movement of said leading edge and said trailing edge of said shutter in accordance with respectively different speed profiles.

33. An apparatus according to claim 31, wherein said control means controls movement of said leading edge and said trailing edge of said shutter to provide different exposure time periods to different portions of the predetermined zone of the workpiece.

34. An apparatus according to claim 31, wherein said control means controls movement of said leading edge and said trailing edge of said shutter to provide an exposure time period to an inside portion of the predetermined zone of the workpiece shorter than to outside portions of the predetermined zone of the workpiece.

35. An apparatus according to claim 31, wherein said shutter includes a belt member having an opening, a portion of which is defined by said leading edge and another portion of which is defined by said trailing edge.

36. An apparatus according to claim 35, wherein said belt member comprises an endless belt member.

37. An apparatus according to claim 31, wherein said shutter device includes a first belt member having an opening, a portion of which is defined by said leading edge and a second belt member having an opening, a portion of which is defined by said trailing edge.

38. An apparatus according to claim 34, wherein said shutter includes a belt member having an opening, a portion of which is defined by said leading edge and another portion of which is defined by said trailing edge.

39. An apparatus according to claim 38, wherein said belt member comprises an endless belt member.

40. An apparatus according to claim 34, wherein said shutter device includes a first belt member having an opening, a portion of which is defined by said leading edge and a second belt member having an opening, a portion of which is defined by said trailing edge.

41. An exposure method for exposing a predetermined zone of a workpiece with synchrotron radiation, said method comprising the steps of:
 providing a shutter having a leading edge effective to start exposure of the predetermined zone of the workpiece and a trailing edge effective to stop the exposure of the predetermined zone of the workpiece;
 expanding the range of irradiation provided to the workpiece by the synchrotron radiation;
 measuring an illuminance profile of the synchrotron radiation having the range of irradiation expanded in said expanding step; and
 independently moving the leading edge and the trailing edge of the shutter through the expanded range of irradiation, while controlling movement of the leading edge and the trailing edge of the shutter in response to the illuminance profile measured in said measuring step.

42. A method according to claim 41, wherein said expanding step comprises divergently deflecting the synchrotron radiation by a mirror to expand the range of irradiation provided by the synchrotron radiation.

43. A method according to claim 41, wherein said expanding step comprises divergently deflecting the synchrotron radiation by a convex mirror to expand the range of irradiation provided by the synchrotron radiation.

44. A method according to claim 41, further comprising moving the leading edge and the trailing edge of the shutter in accordance with respectively different speed profiles.

45. A method according to claim 41, further comprising moving the leading edge and the trailing edge of the shutter to provide different exposure time periods to different portions of the predetermined zone of the workpiece.

46. A method according to claim 41, further comprising moving the leading edge and the trailing edge of the shutter in the same direction to provide an exposure time period to an inside portion of the predetermined zone of the workpiece shorter than to outside portions of the predetermined zone of the workpiece, which outside portions are at opposite sides of the inside portion with respect to the direction of movement of the leading edge and the trailing edge of the shutter.

47. An exposure method for exposing a predetermined zone of a workpiece with synchrotron radiation, said method comprising the steps of:
 determining an illuminance profile of the synchrotron radiation;
 starting exposure of different portions of the predetermined zone of the workpiece with the synchrotron radiation at different time periods by operating a shutter mechanism for controlling passage of the synchrotron radiation; and
 stopping the exposure of the different portions of the predetermined zone of the workpiece at different time periods by operating the shutter mechanism;
 wherein the time periods for starting and stopping exposure of the different portions of the predetermined zone of the workpiece are set in response to the illuminance profile determined in said determining step.

48. A method according to claim 47, further comprising setting the time periods for starting and stopping exposure of the different portions of the predetermined zone of the workpiece to provide different exposure time periods to the different portions of the predetermined zone of the workpiece.

49. A method according to claim 47, further comprising setting the time periods for starting and stopping exposure of the different portions of the predetermined zone of the workpiece to provide an exposure time period to an inside portion of the predetermined zone of the workpiece shorter than to outside portions of the predetermined zone of the workpiece, which outside portions are at opposite sides of the inside portion with respect to the direction of the starting of exposure of the different portions of the predetermined zone of the workpiece.

50. An exposure method for exposing a predetermined zone of a workpiece with synchrotron radiation, said method comprising the steps of:
  determining an illuminance profile of the synchrotron radiation; and
  controlling exposure of different portions of the predetermined zone of the workpiece with the synchrotron radiation by operating a shutter mechanism for controlling passage of the synchrotron radiation, in response to the illuminance profile of the synchrotron radiation determined in said determining step for providing an exposure time period to an inside portion of the predetermined zone of the workpiece shorter than to outside portions of the predetermined zone of the workpiece, which outside portions are at opposite sides of the inside portion with respect to the direction of the starting of exposure of the different portions of the predetermined zone of the workpiece.

51. A method according to claim 50, further comprising divergently deflecting the synchrotron radiation by a mirror and measuring the divergently deflected synchrotron radiation to determine the illuminance profile thereof.

52. A method according to claim 50, further comprising expanding the synchrotron radiation provided from a radiation source by a convex mirror and measuring the expanded synchrotron radiation to determine the illuminance profile thereof.

53. An exposure method for exposing a predetermined zone of a workpiece with synchrotron radiation, said method comprising the steps of:
  determining an illuminance profile of the synchrotron radiation by expanding the synchrotron radiation provided from a radiation source by a convex mirror and measuring the expanded synchrotron radiation;
  controlling exposure of different portions of the predetermined zone of the workpiece with the synchrotron radiation by operating a shutter mechanism for controlling passage of the synchrotron radiation, in response to the illuminance profile of the synchrotron radiation determined in said determining step, for providing an exposure time period to an inside portion of the predetermined zone of the workpiece shorter than to outside portions of the predetermined zone of the workpiece, which outside portions are at opposite sides of the inside portion with respect to the direction of the starting of exposure of the different portions of the predetermined zone of the workpiece;
  starting the exposure of the different portions of the predetermined zone of the workpiece at different time periods; and
  stopping the exposure of the different portions of the predetermined zone of the workpiece at different time periods.

54. An exposure method for exposing a predetermined zone of a workpiece with synchrotron radiation, said method comprising the steps of:
  starting exposure of different portions of the predetermined zone of the workpiece by operating a shutter mechanism for controlling passage of the synchrotron radiation;
  stopping the exposure of the different portions of the predetermined zone of the workpiece by operating the shutter mechanism; and
  interrelating the starting and the stopping of the exposure of the different portions of the predetermined zone of the workpiece to provide an exposure time period to an inside portion of the predetermined zone of the workpiece shorter than to outside portions of the predetermined zone of the workpiece, which outside portions are at opposite ends of the inside portion.

55. A method according to claim 54, further comprising divergently deflecting the synchrotron radiation by a mirror and exposing the predetermined zone of the wafer workpiece with the divergently deflected synchrotron radiation.

56. A method according to claim 54, further comprising emitting the synchrotron radiation from a radiation source and expanding the emitted synchrotron radiation by a convex mirror and exposing the predetermined zone of the workpiece with the expanded synchrotron radiation.

57. An exposure method for exposing a predetermined zone of a workpiece with synchrotron radiation, said method comprising the steps of:
  starting exposure of different portions of the predetermined zone of the workpiece at different time periods by operating a shutter mechanism for controlling passage of the synchrotron radiation;
  stopping the exposure of the different portions of the predetermined zone of the workpiece at different time periods by operating the shutter mechanism; and
  interrelating the starting and the stopping of the exposure of the different portions of the predetermined zone of the workpiece to provide an exposure time period to an inside portion of the predetermined zone of the workpiece shorter than to outside portions of the predetermined zone of the workpiece, which outside portions are at opposite ends of the inside portion.

58. A wafer processing apparatus for the manufacture of semiconductor devices, said apparatus comprising:
  a mirror for expanding synchrotron radiation emitted from a synchrotron radiation source;
  a wafer holder for holding a semiconductor wafer;
  a shutter for controlling exposure of the semiconductor wafer with the expanded synchrotron radiation, said shutter comprising a leading edge effective to start the exposure and a trailing edge effective to stop the exposure; and
  driving means for moving said leading edge and said trailing edge of the shutter in a direction substantially perpendicular to a direction of an electron orbit plane which produces the synchrotron radiation for exposure of the semiconductor wafer.

59. An apparatus according to claim 58, wherein said shutter comprises a belt in which said leading and trailing edges are formed, said belt being movable in the direction substantially perpendicular to the direction of the electron orbit plane.

60. An apparatus according to claim 59, wherein said mirror expands the synchrotron radiation in a substantially vertical direction.

61. A semiconductor device manufacturing exposure method comprising the steps of:
supplying synchrotron radiation for exposure of a semiconductor wafer;
expanding the supplied synchrotron radiation with mirror;
placing a semiconductor wafer on a wafer holder;
moving a leading edge of a shutter in a direction substantially perpendicular to a direction of an electron orbit plane of the supplied synchrotron radiation to start exposure of a zone of the semiconductor wafer with the expanded synchrotron radiation; and
moving a trailing edge of the shutter in the direction substantially perpendicular to the direction of the electron orbit plane to stop the exposure of the zone of the wafer with the expanded synchrotron radiation.

62. A method according to claim 61, further comprising, with respect to the direction substantially perpendicular to the direction of the electron orbit plane, exposing a central portion of the zone of the semiconductor wafer with the synchrotron radiation for a time period shorter than each of the end portions of the zone of the semiconductor wafer.

63. A semiconductor device manufacturing exposure apparatus, comprising:
a mirror for expanding synchrotron radiation in a direction substantially perpendicular to an electron orbit plane to illuminate for exposure a predetermined zone of a semiconductor wafer at one time, the mirror being maintained stationary at least during exposure of the predetermined zone of the wafer; and
control means for controlling the exposure time at each portion of the predetermined zone of the wafer in relation to an illuminance profile of the synchrotron radiation expanded by said mirror, said control means comprising means for controlling exposure of at least one portion of the predetermined zone of the wafer for an exposure time different from that of another portion of the predetermined zone of the wafer.

64. An apparatus according to claim 63, wherein said control means further comprises means for controlling exposure to expose an inside portion of the predetermined zone of the wafer for an exposure time shorter than that of an end portion of the predetermined zone of the wafer.

65. A semiconductor device manufacturing exposure method, comprising the steps of:
expanding, using a mirror, synchrotron radiation in a direction substantially perpendicular to an electron orbit plane to illuminate for exposure a predetermined zone of a semiconductor wafer at one time;
maintaining the mirror stationary at least during exposure of the predetermined zone of the wafer; and
controlling the exposure time at each portion of the predetermined zone of the wafer in relation to an illuminance profile of the synchrotron radiation from the mirror to expose at least one portion of the predetermined zone of the wafer for an exposure time different from that of another portion of the predetermined zone of the wafer.

66. A method according to claim 65, further comprising exposing an inside portion of the predetermined zone of the wafer for an exposure time shorter than that of an end portion of the predetermined zone of the wafer.

67. A microdevice manufacturing exposure method, comprising the steps of:
expanding, using a mirror, synchrotron radiation in a direction substantially perpendicular to an electron orbit plane to illuminate for exposure a predetermined zone of a workpiece at one time;
maintaining the mirror stationary at least during exposure of the predetermined zone of the workpiece; and
controlling the exposure time at each portion of the predetermined zone of the workpiece in relation to an illuminance profile of the synchrotron radiation from the mirror to expose at least one portion of the predetermined zone of the workpiece for an exposure time different from that of another portion of the predetermined zone of the workpiece.

68. A method according to claim 67, further comprising exposing an inside portion of the predetermined zone of the workpiece for an exposure time shorter than that of an end portion of the predetermined zone of the workpiece.

* * * * *

UNITED STATES PATENT AND TRADEMARK OFFICE
CERTIFICATE OF CORRECTION

PATENT NO. : 5,365,561
DATED : November 15, 1994
INVENTOR(S) : Ryuichi EBINUMA, et al.

Page 1 of 2

It is certified that error appears in the above-indentified patent and that said Letters Patent is hereby corrected as shown below:

ON THE COVER PAGE:

UNDER "OTHER PUBLICATIONS":

"pp. 171-181." should read --1962, pp. 171-181.--.

IN THE ABSTRACT:

Line 21, "make" should read --made--.

COLUMN 1:

Line 23, "with a" should read --with--.

COLUMN 5:

Line 33, "of" should be deleted.

COLUMN 6:

Line 16, "$T_{Ei}-T_{Fi}-T_i \pm 0$  (3)" should read --$T_{Ei}-T_{Fi}-T_i=0$  (3)--;
Line 20, "at" should read --with--; and
Line 39, "moved" should read --moved in--.

COLUMN 7:

Line 12, "the" (first occurrence) should be deleted.

UNITED STATES PATENT AND TRADEMARK OFFICE
CERTIFICATE OF CORRECTION

PATENT NO. : 5,365,561
DATED : November 15, 1994
INVENTOR(S) : Ryuichi EBINUMA, et al.

It is certified that error appears in the above-indentified patent and that said Letters Patent is hereby corrected as shown below:

COLUMN 8:

Line 58, "increases" should read --increase--.

COLUMN 11:

Line 14, "comprises" should read --comprises a--.

COLUMN 16:

Line 56, "mechanism;" should read --mechanism,--.

COLUMN 18:

Line 22, "wafer" should be deleted.

COLUMN 19:

Line 8, "with" should read --with a--.

Signed and Sealed this

Sixth Day of June, 1995

BRUCE LEHMAN

*Attest:*

*Attesting Officer*  *Commissioner of Patents and Trademarks*